United States Patent [19]

Tsukada et al.

[11] 4,394,749

[45] Jul. 19, 1983

[54] PHOTOELECTRIC DEVICE AND METHOD OF PRODUCING THE SAME

[75] Inventors: Toshihisa Tsukada, Tokyo; Yukio Takasaki, Hachioji; Tadaaki Hirai, Koganei; Toru Baji, Kokubunji; Hideaki Yamamoto, Hachioji; Yasuo Tanaka, Kokubunji; Eiichi Maruyama, Kodaira; Sachio Ishioka, Tokyo, all of Japan

[73] Assignee: Hitachi, Ltd., Tokyo, Japan

[21] Appl. No.: 154,999

[22] Filed: May 30, 1980

[30] Foreign Application Priority Data

Jun. 8, 1979 [JP] Japan .................................. 54-71272
Nov. 9, 1979 [JP] Japan ............................... 54-144415

[51] Int. Cl.³ .......................................... G11C 13/00
[52] U.S. Cl. ...................................... 365/106; 365/112
[58] Field of Search ......................... 340/166; 338/17; 129/572; 357/31; 365/106, 112, 118

[56] References Cited

U.S. PATENT DOCUMENTS 4,040,985 8/1977 Shidara ............................... 313/386

FOREIGN PATENT DOCUMENTS 2451107 3/1980 France ................................ 365/174
2044996 10/1980 United Kingdom ................ 365/174

Primary Examiner—Terrell W. Fears
Attorney, Agent, or Firm—Antonelli, Terry & Wands

[57] ABSTRACT

A photoelectric device having at least a predetermined impurity region which is disposed in a semiconductor substrate, and a photoelectric conversion portion which is constructed by stacking an electrode layer lying in contact with at least a part of the impurity region, a photoconductive material layer overlying the electrode layer, and a transparent electrode overlying the photoconductive material layer, characterized in that the photoconductive material layer is made of an amorphous chalcogenide material which principally contains Se, is disclosed. It is very favorable that the photoelectric conversion material layer made of the amorphous material principally containing Se is partially doped with Te so as to enhance its sensitivity. The amorphous chalcogenide material is very useful in the following point. In the course of forming, or after having formed, at least one photoconductive layer on a semiconductor body whose surface is uneven, a heat treatment is performed at a temperature of at least the softening point of the photoconductor so as to flatten the layer, whereby discontinuous parts of the photoconductor ascribable to the uneven surface of the semiconductor body can be avoided.

8 Claims, 14 Drawing Figures

PHOTOELECTRIC DEVICE AND METHOD OF PRODUCING THE SAME

BACKGROUND OF THE INVENTION

1. Field of the Invention

This invention relates to a photoelectric device employing a photoconductive layer, and also to a method of producing the same.

2. Description of the Prior Art

As a typical example of a photoelectric device employing a photoconductive layer, there is a solid-state imaging device.

The solid-state imaging device is such that an image pickup screen is formed by arranging a plurality of solid-state elements having the function of photoelectric conversion and the function of signal storage, each of the solid-state elements corresponding to one picture element, and that the image pickup screen is sequentially scanned thereby to convert external image information into electric signals. More specifically, the photoconductive layer which forms the image pickup screen is disposed in a manner to cover a semiconductor body in which switching elements, scanning circuits etc. are formed. Examples of such solid-state imaging devices are known from Japanese Published Unexamined Patent Application No. 51-10715 etc.

The solid-state imaging device has the features of small size, light weight, no necessity for a high voltage, etc., but it has not attained practicable characteristics yet.

The characteristics of photosensitivity, spectral response etc. have been unsatisfactory. Further, as a problem inherent to the solid-state imaging device, there has been the difficulty that white flaws appear on a reproduced picture.

SUMMARY OF THE INVENTION

In a photoelectric device having at least a predetermined impurity region which is disposed in a semiconductor substrate, and a photoelectric conversion portion which is constructed by stacking an electrode layer lying in contact with at least a part of the impurity region, a photoconductive material layer overlying the electrode layer, and a transparent electrode overlying the photoconductive material layer; this invention is characterized in that the photoconductive material layer is made of an amorphous chalcogenide material which principally contains Se. Preferably, the amorphous chalcogenide material layer principally containing Se is partially doped with Te so as to enhance its sensitivity.

Further, a structure in which the following four layers (a)–(d) are successively stacked in adjacency is especially preferred for the photoconductive material layer:

(a) First part which contains Se, which is doped with at least one of Te and elements adapted to form deep levels in Se, and in which the quantity of Te and that of the element adapted to form the deep level in Se are respectively at least 10 atomic-% on the average.

(b) Second part which contains Se, and in which a peak concentration of a continuous distribution of the element adapted to form the deep level in Se, the second part being doped with the element, is at least 15 atomic-%.

(c) Third part which contains Se, and in which a peak concentration of a continuous distribution of Te, the third part being doped with the Te, is at least 15 atomic-%.

(d) Fourth part which contains Se, which is doped with at least one of Te and the elements adapted to form the deep levels in Se, and in which the quantity of Te and that of the element adapted to form the deep level in Se are respectively at most 15 atomic-% on the average.

In forming the photoconductive material layer as above stated on a semiconductor body whose surface has uneven regions as in a solid-state imaging device, it is very favorable that, in the course of or after the formation of at least one layer of a photoconductor to overlie the semiconductor body, a heat treatment is carried out at a temperature of or above the softening point of the photoconductor so as to flatten the photoconductor layer. This treatment can avoid any discontinuous part of the photoconductor layer attributed to the uneven surface of the semiconductor body. Accordingly, white flaws etc. can be prevented from occurring in a picture reproduced by the use of the photoelectric device.

DETAILED DESCRIPTION OF THE PREFERRED EMBODIMENTS

Figure 1:
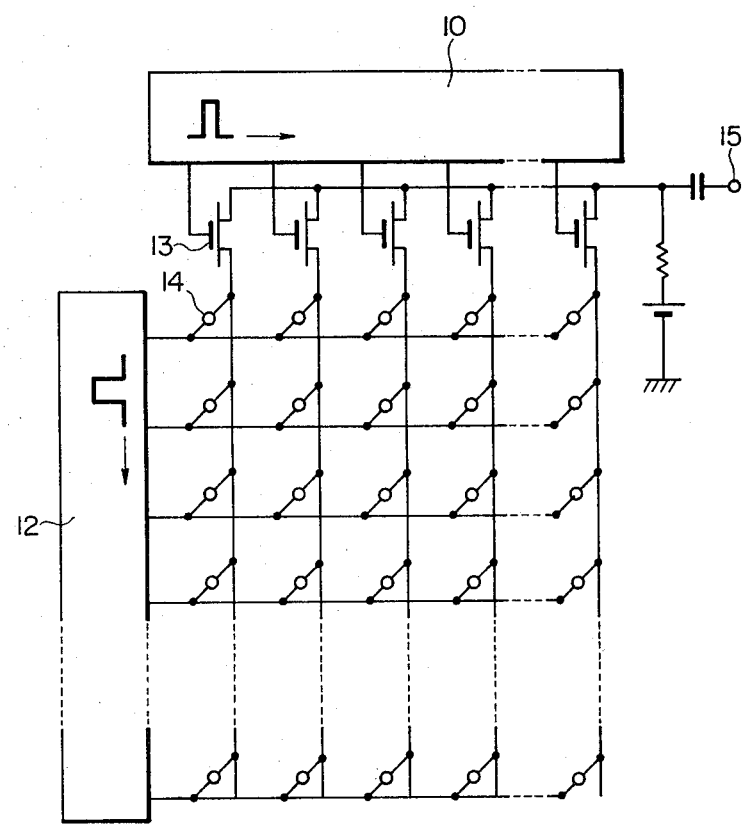
FIG. 1 is a diagram showing the principle of a solid-state imaging device.

FIG. 1 illustrates the principle of a solid-state imaging device. Picture elements 14 are arranged in the form of a matrix, and are read out one by one by means of an XY-address system. The respective picture elements are addressed by a horizontal scan signal generator 10 and a vertical scan signal generator 12. Numeral 13 designates a switching portion connected to the picture elements, and numeral 15 an output terminal.

The construction of the picture element portion of such solid-state imaging device will be exemplified below.

Figure 2:
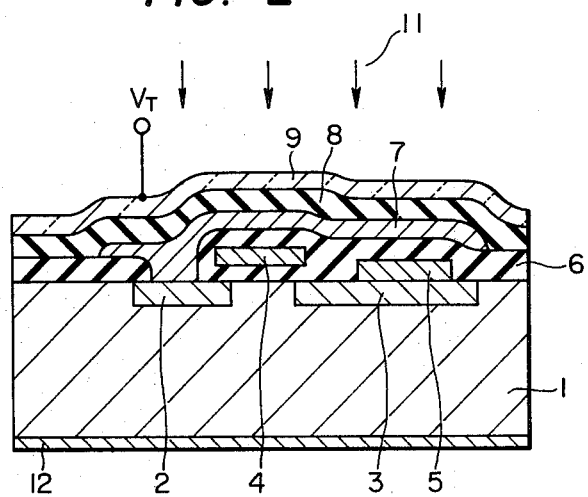
FIG. 2 is a sectional view of a picture element portion.

As shown in FIG. 2, a scanning circuit and a switching circuit are integrated on a Si substrate 1, and a photoconductive thin film 8 fulfilling the function of photoelectric conversion is deposited on the IC substrate. The operating principle will be described in accordance with FIG. 2. Incident light 11 arrives at the photoconductive film 8 through a transparent electrode 9. Here the light is absorbed to create electron-hole pairs, and these carriers are stored in an electrode 7 by a bias voltage $V_T$. The stored carriers are switched by an insulated-gate field effect transistor (hereinbelow, shortly written "MOSFET") which consists of a source 2, a drain 3 and a gate 4 formed on the semiconductor substrate 1, and they are taken out through a signal line 5. Numeral 6 indicates an insulating film. An electrode 12 on the rear surface of the semiconductor substrate 1 is usually grounded. With the present structure, since the scanning circuit and the photoelectric conversion portion are isolated, the degradations of resolution and photosensitivity are not incurred, and moreover, since the light does not reach the Si substrate, blooming is not likely to occur.

As the material of the photoconductive film 8 for realizing such structure, the amorphous calcogenide material which principally contains Se is especially favorable as stated before.

Further, when put into a structure as described below, the amorphous chalcogenide material layer can provide a solid-state imaging device having especially favorable characteristics.

Figure 3:
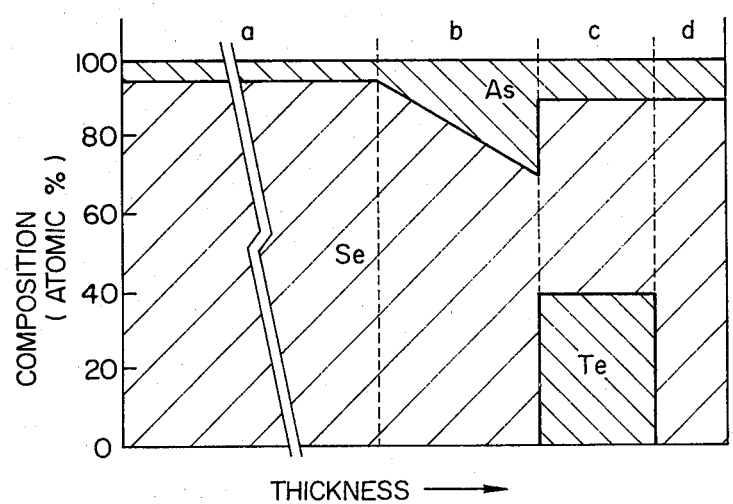
FIG. 3 is a diagram of the composition distribution of a typical photoelectric conversion material layer according to this invention.

FIG. 3 is a composition distribution diagram showing the construction of this photoconductor layer. A part a in FIG. 3 is a Se layer which contains at least one element selected from the group consisting of Te and elements to form deep levels in Se, and in which the quantity of Te and that of the element adapted to form the deep level in Se are respectively at most 10 atomic-% on the average.

However, in a case where the lifetime is not very important, a mere Se layer may be used as well.

The element or elements considered to form the deep level or levels in Se may well be at least one of group-Vb elements such as As, Sb and Bi and group-IV elements such as Si and Ge or at least one of compounds containing at least one of these elements. These elements may coexist with Te, or only these elements may be included as well. With such elements adapted to form the deep levels, even when the device is especially operated continuously for a long time, the variation of a signal current is very small, and the lag is conspicuously reduced.

The part a ordinarily has a thickness of 0.5-10 μm, and principally has the effects of causing holes generated in a part c to travel, diminishing the capacitance of the photoconductor and avoiding pinholes etc. More desirably, the thickness of the part a is 1-4 μm.

A part b in the figure is a part in which the dopant to form the deep level (in this case, As) is introduced, and which serves to enhance the effect of intensifying the sensitivity to red as based on Te included in the part c in the figure and also to suppress the signal current variation in the case of operating the device for long. In order to effectively perform the functions, the Se layer requires that the concentration of the dopant to form the deep level is at least 15 atomic-% at the position of the peak of a continuous concentration distribution. In practical use, concentrations of or below 40 atomic-% are often employed. The shape of the concentration distribution of the dopant to form the deep level in the part b in the figure should desirably such that the concentration is the highest at the interface contacting with the part c and smoothly lowers over 200-3,000 Å as the position comes away from the interface. This layer usually has a thickness of 100 Å-5,000 Å.

The part c in FIG. 3 needs to be a Se layer in which the peak concentration of the continuous distribution of Te concentrations is at least 15 atomic-%, particularly desirably within a range of 15-30 atomic-%, in order to attain a sufficient sensitivity to the visible light region. It is also desirable that the thickness of this part is 200-5,000 Å. The distribution of the Te concentrations of the part c in FIG. 3 is uniform and has a rectangular shape, but the shape of the distribution is not restricted to the illustrated one. The Te concentrations may well be in a distribution having a triangular, trapezoidal, semicircular or more complicated shape. A part d in FIG. 3 is necessary in order that this film may form a rectifying contact in touch with the n-type transparent conductive film to overlie the photoconductor layer. To the end of attaining a stable rectifying contact, it is preferable that the Te concentration of this Se layer part does not exceed 15 atomic-% on the average. It is also preferable that an element such as As and Ge which is added to the end of increasing the thermal stability does not exceed 15 atomic-% on the average. The thickness of this part needs to be at least 100 Å. In case where the lifetime is not a considerable problem, a mere Se layer may be used as well.

However, when this part is made thicker than is necessary, the quantity of light to enter the part c decreases to lower the sensitivity. In practical use, therefore, a thickness of or below 1,000 Å is desirable.

In case of this invention, the concentration distributions of Te, As, Ge etc. may be grasped as continuous distributions considered macroscopically, and the concentrations may be controlled as such.

In case of the photoconductive film of this invention, by employing Se and $As_2Se_3$ or Te and Ge etc. as vaporization sources and using an evaporation equipment of the rotary type, the vaporization products are stacked on a substrate for evaporation in the form of thousands of circulative layers each being a thin layer of several to several tens angstroms, whereby the products are put into macroscopically continuous distributions, and a film exhibiting a desired composition ratio or composition distribution can be obtained.

In this case, the composition ratio of the continuous distribution is defined as the continuous distribution of an average composition ratio within a multiple layer which is constructed of the sum of the individual layers of one or more sorts of vaporization products evaporated circulatively, that is, a multiple layer which is formed by one cycle of the rotary evaporation.

The chalcogenide amorphous material which principally contains Se can be made a flat photoconductor layer by performing a heat treatment to be described in detail below. Accordingly, the reproduced picture of good quality as stated before can be obtained.

Regarding the solid-state imaging device whose sectional view in the picture element portion is shown in FIG. 2, the scanning circuit and the switching circuit are first formed on the Si substrate 1, and the amorphous thin film is subsequently formed as the photoconductor layer by, for example, the vacuum evaporation. However, considerable unevenness exists on the Si substrate 1. While the magnitudes of steps on the Si substrate are 1-2 μm, those of steps the photoconductive thin film formed on the substrate are, in general, 2-4 μm. Accordingly, discontinuous parts of the photoconductive film appear at the stepped parts of the Si substrate. The discontinuous parts act as pinholes when providing the transparent electrode 9, and form a cause for short-circuiting. As the drawback of the imaging device, they appear as white flaws in the reproduced picture and degrade the picture quality.

However, the chalcogenide amorphous material whose principal constituent is Se according to this invention is a material which can compensate for the disadvantage and provide a sufficiently good picture quality. More specifically, in the course of the deposition or after the deposition of the amorphous thin film on the Si substrate provided with the scanning circuit etc., the heat treatment is carried out at a temperature of 5 or above the softening point of the amorphous thin film, whereby the thin film is flattened to remove the discontinuous parts of the thin film and to avoid the white flaw defects otherwise appearing on a TV monitor. As the temperature of the heat treatment, at least 50° C. is desirable. More preferably, the heat treatment is performed at a temperature which is at least 100° C. and at which the quality of the thin film material does not change. For amorphous substances in which Se is an indispensable constituent element, a temperature of at most 120° C. is preferable in practice. An atmosphere during the heating may be nitrogen, a rare gas, air or the like.

In case where the film is deposited while heating, a preferable heating time is within about 15 minutes. In case of heating after the deposition, the layer is flattened in a very short time at temperatures of and above the softening point of the amorphous material, and hence, the heating period of time is about 5 minutes. The heating in the short time is also important in the sense of preventing the diffusion of the dopant impurities.

Needless to say, such method is applicable, not only to the solid-state imaging device, but also to general cases where a photoconductor layer is to be disposed on a substrate having uneven parts.

Hereunder, this invention will be described in detail in connection with embodiments.

EMBODIMENT 1

Figure 4:
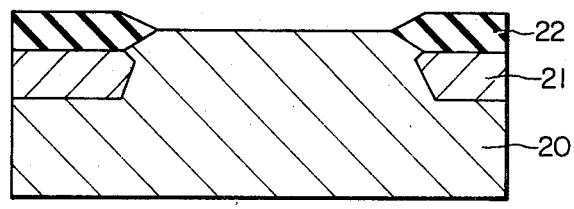
FIGS. 4 to 9 and FIG. 11 are sectional views of essential portions each showing the step of a process for producing a solid-state imaging device according to this invention.
Figure 5:
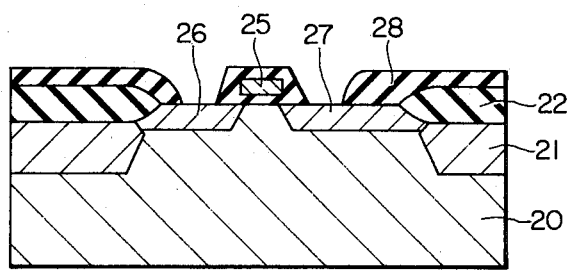
Figure 6:
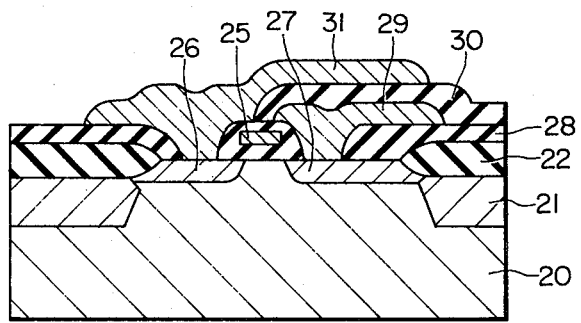

FIGS. 4 to 9 are sectional views of a picture element portion showing a method of producing a solid-state imaging device. A switching circuit and a scanning circuit etc. to be formed on a semiconductor substrate are fabricated by the use of processes for conventional semiconductor devices. A thin $SiO_2$ film of approximately 800 Å is formed on a p-type silicon substrate 20, and a $Si_3N_4$ film of approximately 1,400 Å is formed on a predetermined position of the $SiO_2$ film. Herein, the $SiO_2$ film was formed by the conventional CVD process, and the $Si_3N_4$ film by the CVD process in which $Si_3N_4$, $NH_4$ and $N_2$ were caused to flow. A p-type diffused region 21 is formed by the ion implantation from above the silicon substrate. The diffused region 21 is disposed in order to better the isolation of respective elements. Subsequently, in an atmosphere of $H_2:O_2=1:8$, the silicon is locally oxidized to form a $SiO_2$ layer 22 (FIG. 4). This method is the local oxidation of silicon for isolating elements as is generally termed "LOCOS". The $Si_3N_4$ film and the $SiO_2$ film above stated are once removed, and a gate insulating film of a MOS transistor is formed of a $SiO_2$ film. Subsequently, a gate portion 25 made of polycrystalline silicon and diffused regions 26 and 27 are formed, whereupon they are overlaid with a $SiO_2$ film 28. Electrode lead-out windows for the source 26 and the drain 27 are provided in the film by etching (FIG. 5). As a drain electrode 29, Al is evaporated 8,000 Å. Further, a $SiO_2$ film 30 is formed to a thickness of 7,500 Å, and Al is continuously evaporated 1 μm as a source electrode 31. FIG. 6 is a sectional view showing this state.

Figure 10:
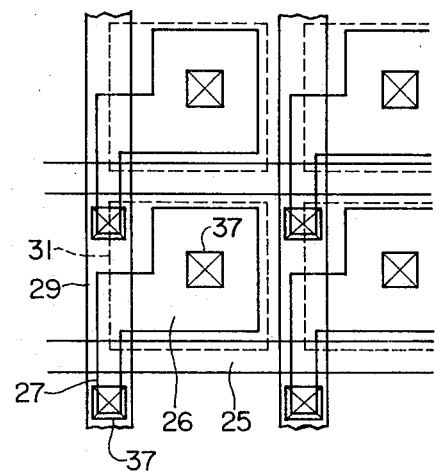
FIG. 10 is a plan view of a solid-state imaging device embodying this invention.

In the peripheral edge of the light receiving area, circuits of a shift register etc. are arranged. Thus, a scanning circuit portion is finished up. A light receiving portion is formed on the scanning circuit portion. FIG. 10 shows a plan view of a Si body part. Numeral 37 designates a contact hole for an electrode. In the figure, the same numerals as in the foregoing sectional views indicate the same parts.

On the semiconductor body thus prepared, a Se-As layer 32 which contains 5 atomic-% of arsenic is formed to a thickness of 3 μm. It is the part a in the composition distribution diagram of FIG. 3.

Figure 7:
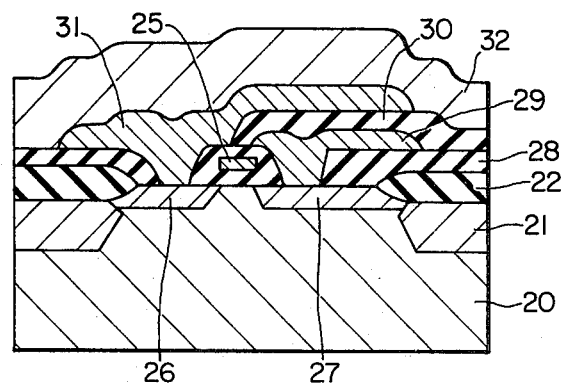
Figure 8:
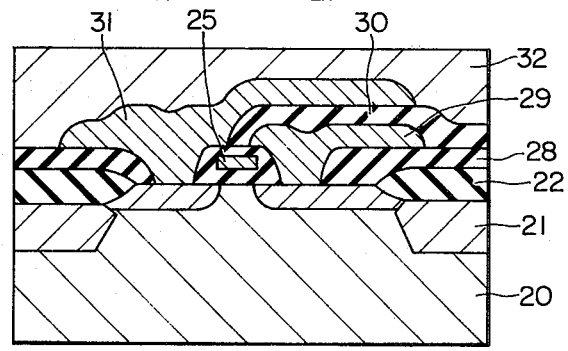
Figure 9:
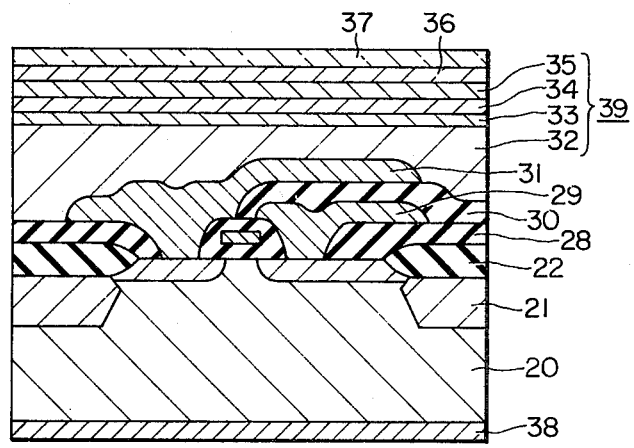

As seen from FIG. 6, the front surface of the semiconductor body is uneven after the scanning circuit etc. have been formed on the semiconductor substrate 20. Under this state, accordingly, the front surface of the Se-As layer reflects the unevenness of the IC substrate and is not flat as illustrated in FIG. 7. Subsequently, the body is subjected to a heat treatment at 110° C. for 5 minutes in an atmosphere of nitrogen gas. Since the softening point of this Se-As is approximately 70° C., the layer is softened and flattened as shown in FIG. 8 by the heat treatment. As the temperature of the heat treatment, the temperature is made a value which is at least 80° C. and at which the quality of the thin film material does not change. For amorphous substances in which Se is an indispensable constituent element, a temperature of at most 120° C. is preferable in practice. The atmosphere during the heaating may be nitrogen, a rare gas, air or the like.

The chalcogenide amorphous material whose principal constituent is Se does not undergo a change in its photoconductive characteristics even when subjected to the heat treatment.

As the heating method, by way of example, irradiation via a lamp (for example, halogen lamp) is a favorable method.

On the first layer 32, a second layer 33 (part b) made of Se and As is evaporated. In case of evaporating the second layer 33, Se and $As_2Se_3$ are respectively put in separate evaporation boats and are simultaneously vaporized. At this time, current to flow through the evaporation boat for $As_2Se_3$ is controlled, whereby the concentration of As is made 5 atomic-% at first, to increase smoothly with the proceeding of the evaporation, and to become 15 atomic-% to 25 atomic-% at the end of a third layer 34 having a thickness of 500–1,500 Å. Subsequently, Se and Te are respectively and simultaneously evaporated from separate evaporation boats to form the third layer 34 (part c). The third layer 34 contains Te uniformly, and has its thickness made 500–2,000 Å and its Te concentration made 15 atomic-% to 25 atomic-%. As a fourth layer 35 (part d), Se containing 10 atomic-% of As is evaporated on the third layer to a thickness of 100 Å to 500 Å.

The above evaporation is carried out in a vacuum of $3 \times 10^{-6}$ Torr. It is preferable that a blocking layer 36 such as $CeO_2$ film is inserted on the fourth layer 35. Although this layer is not always necessary, it produces the effect of hindering the flow of holes and can suppress the dark current. Preferable as the material of this layer is a substance whose principal constituent is an oxide of at least one element selected from the group consisting of Ce, Zn, Cd, B, Al, Sc, Y, Si, Ge, Ti, Zr, Hf, Th, La, Sb, Bi, V, Nb, Ta, Fe, U, W and Mo. As typical examples of the oxide, there are $CeO_2$, CdO, $B_2O_2$, $Sc_2O_3$, $ZrO_2$, $ThO_2$, $Fe_2O_3$, $Cr_2O_3$, CoO, $Co_2O_3$, $Pr_2O_3$, $Tc_2O_3$, $ReO_3$, MgO, $WO_3$, $PbCrO_4$, $Nb_2O_3$, $Ta_2O_3$, $Bi_2O_3$, $V_2O_5$, $Y_2O_3$, $HfO_2$, $La_2O_3$, $GeO_2$, NiO, $Cu_2O$, MnO, $U_3O_8$, BeO, $WO_3$, $Mo_2O_5$, $Al_2CoO_4$, etc.

The blocking layer is usually made a thickness of approximately 100 Å–400 Å.

The blocking layer is not restricted to this example, but is extensively applicable to photoconductive layers according to this invention.

A transparent electrode 37 is subsequently formed to finish up an amorphous film element. As the transparent electrode, a very thin film of gold or the like or a transparent conductive film containing indium oxide or tin oxide which can be formed at a low temperature may be employed. A refined metal film or the like may be made the light transmissive electrode as well.

Lastly, a conductor film 38 in ohmic contact is disposed on the other surface of the semiconductor substrate 20. In general, the conductor film 38 is grounded through a terminal.

Cr-Au is evaporated on a part of the transparent electrode by the use of a mask, and is subjected to the wire bonding into a biasing electrode.

In this way, a solid-state imaging device of a high signal-to-noise ratio and a high picture quality free from blooming was obtained. The signal current of this device responsive to a unit area illumination was about 71 nA/lx with respect to a white light source having a color temperature of 3,200° K., and the spectral sensitivity was 0.28 $\mu A/\mu W$ (0.78 in terms of the quantum efficiency) for blue (450 nm).

Here, the effect of flattening the photoconductor layer by the heating will be referred to. Table 1 indicates the results of the comparison between the case where the Se-As layer (first layer) was flattened and the case where it was not flattened.

TABLE 1

| White flaws in reproduced picture | |
|---|---|
| this invention | without heat treatment |
| several - 0 | 250 (flaws/cm$^2$) × 42 (cm$^2$) = 10,500 flaws | picture screen: about 42 cm$^2$

As apparent from Table 1, when this invention is not adopted, white flaws appear in very large numbers.

Although, in the present embodiment, the scanning circuit is exemplified as being constructed of the MOS type field effect transistors, this invention is not restricted thereto. Needless to say, the scanning circuit may well employ, for example, the transfer regions of a CCD (Charge Coupled Device). It is a matter of course that other circuit systems can be employed even when the MOS type transistors are used.

In addition, a solid-state imaging device as described hereunder was fabricated. Likewise to the embodiment thus far described, it did not undergo the white flaws on a reproduced picture involved in the prior-art device.

Figure 11:
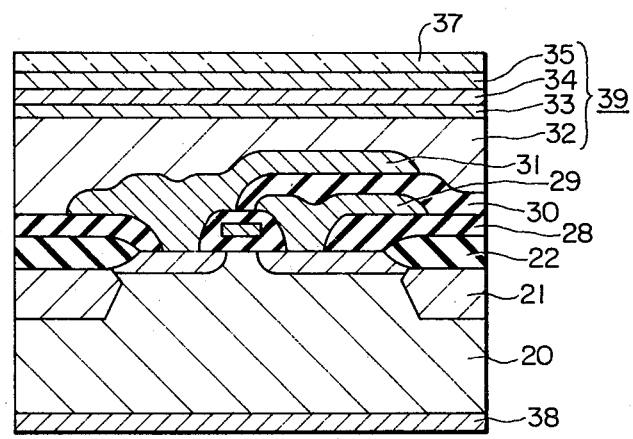

As in the foregoing example, the switching circuit and the scanning circuit portion etc. are formed in the semiconductor body. FIG. 6 is the sectional view of the body showing this state. Subsequently, a Se-As layer 32 containing 8 atomic-% of arsenic is formed to a thickness of 1 $\mu$m. The semiconductor body thus prepared is subjected to a heat treatment at 150° C. for 3 minutes in the air. Thereafter, a Se-As-Te layer (As: 2 atomic-%, Te: 21 atomic-%) 33 and a Se-As layer (As: 6 atomic-%) 34 are deposited by the vacuum evaporation, whereupon a transparent electrode 37 is formed. Lastly, a conductor film 38 in ohmic contact with the other surface of the semiconductor substrate 20 is disposed. In general, the conductor film 38 is grounded through a terminal. FIG. 11 is a sectional view showing this state.

In this example, the photoconductive film is constructed of the three layers of the Se-As layer, the Se-As-Te layer and the Se-As layer. Needless to say, however, this invention is effective when applied to a photoconductive film which is constructed of a single layer or which is constructed of a multiple layer of at least four layers.

EMBODIMENT 2

As in Embodiment 1, a switching circuit and a scanning circuit etc. are formed in a predetermined semiconductor body. Subsequently, a Se-Ge layer (germanium content: 5 atomic-%) is deposited by the vacuum evaporation while holding the temperature of the body at 60° C. Within an evaporation equipment, the layer is subjected to a heat treatment at 100° C. for 3 minutes. The surface of the photoconductive film is flattened by this step.

Subsequently to this layer, Se and Ge are respectively and simultaneously evaporated from individual evaporation boats in a vacuum of $3 \times 10^{-6}$ Torr. In this case, the Ge concentration is made 5 atomic-% at the initial stage of the evaporation, to increase smoothly with the proceeding of the evaporation, and to become 20-25 atomic-% when the thickness of this layer has reached 500–1,500 Å.

At the next step, Se and Te are evaporated to form the region c of the photoconductive film. At this time, the composition is controlled so that the Te concentration may be 20-25 atomic-% at the initial stage of the evaporation, thereafter decrease smoothly, and become 0-5 atomic-% at a thickness of 1,000 Å.

Further, as the region d of the photoconductive film, a film of Se containing 10 atomic-% of Ge is formed 300 Å.

As in Embodiment 1, a transparent electrode is formed on the photoconductive film to finish up an amorphous thin film element.

Even when, as the element to form the deep level within Se, Ge is substituted by Sb, Bi or Si, the predetermined effect can be achieved. These elements including As etc. may coexist as well. Further, the element to form the deep level within Se may be replaced with Te, and Te and these elements may coexist as well.

EMBODIMENT 3

As in Embodiment 1, a switching circuit and a scanning circuit etc. are formed in a predetermined semiconductor body. FIG. 6 is a sectional view of the body showing this state. Subsequently, a Se-As layer (arsenic content: 8 atomic-% or less) 32, a Se-As-Te layer (As: 2 atomic-%, Te: 21 atomic-%) 33 and a Se-As layer (As: 6 atomic-%) 34 are successively formed by the vacuum evaporation while holding the temperature of the body at 60° C. Subsequently, a heat treatment at 100° C. for 3 minutes is performed within an evaporation equipment. The surface of the photoconductive film is flattened by this step. At the next step, a transparent conductive film is formed. Then, a solid-state imaging device is fabricated.

White flaw defects etc. noted in the prior-art device do not occur in this example, either.

EMBODIMENT 4

There will be described an example which employs the transfer regions of a CCD (Charge Coupled Device) as a scanning circuit.

Figure 12:
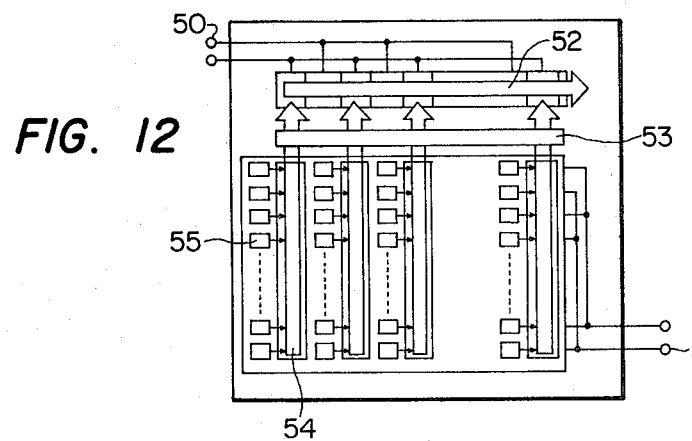
FIG. 12 is an explanatory view of an embodiment which employs a CCD as a scanning circuit.

FIG. 12 shows an explanatory plan view of the arrangement of respective elements. Numeral 50 designates a horizontal clock terminal, numeral 51 a vertical clock terminal, numeral 52 an output horizontal shift register, numeral 53 a vertical transfer gate, numeral 54 a vertical analog shift register, and numeral 55 a picture element portion which comprises in combination a diffused region and a MOS type switching element employing the diffused region as its source.

Figure 13:
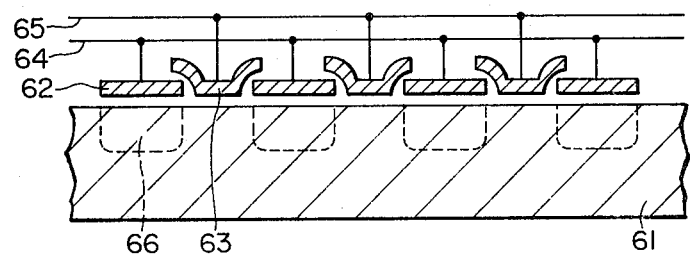
FIG. 13 is a sectional view of a CCD transfer region.
Figure 14:
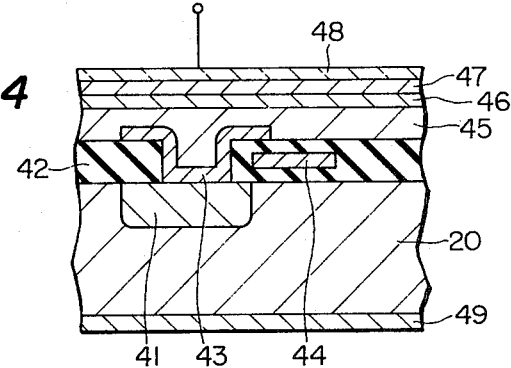
FIG. 14 is a sectional view of a photosensor portion.

FIG. 13 is a sectional view of the CCD transfer regions, while FIG. 14 is a sectional view of the picture element portion.

Referring to FIG. 13, electrodes 62 and 63 are formed on a Si substrate 61 through an insulating layer and have two-phase clock voltages applied thereto through lines 64 and 65. Thus, a potential well within the Si substrate moves to transfer charges. In FIG. 13 which is the sectional view of the light receiving region or picture element portion, numeral 41 indicates a diffused layer, numeral 42 an insulating layer, numeral 43 a metal electrode, numeral 44 a gate, numeral 45 a photoconductive film, and numeral 46 a transparent electrode. The CCD transfer regions shown in FIG. 13 are formed continuously to the light receiving region. The transparent electrode 46, the photoconductive film 45 and the metal electrode 43 form the light receiving portion. The switching region which moves carriers induced here to the transfer region is the portion having the gate 44, and forms a substantial MOS switch.

The Si substrate formed with the CCD transfer regions and the MOS switching portions is prepared, and is subjected to an evaporation in a vacuum evaporation equipment. The Se-As layer (As: 8 atomic-% or less) 45 being 3 μm thick is formed. In this state, the surface of the Se-As layer 45 reflects the unevenness of the body and is not flat. Subsequently, the body is subjected to a heat treatment at 110° C. for 5 minutes in a nitrogen gas atmosphere. Further, on the flattened Se-As layer 45, a Se-As-Te layer (As: 2 atomic-%, Te: 21 atomic-%) 46 being 0.05 μm thick and a Se-As layer (As: 6 atomic-%) 47 being 0.02 μm are successively deposited. On the photoconductor layer, a transparent electrode 48 is formed as in the previous description. Cr-Au is evaporated on a part of the transparent electrode by the use of a mask, and a wire is bonded here to form a biasing electrode.

Lastly, a conductor film 49 in ohmic contact is disposed on the other surface of the semiconductor substrate 20. In general, the conductor film 49 is grounded through a terminal.

Referring to FIG. 12, the operation will be briefly explained. When light falls on the light receiving portion through the transparent electrode, carriers induced by this light signal are shifted to the vertical shift register 54 by applying a voltage to a gate electrode between the diffused region in the light receiving portion 55 and the vertical analog shift register 54. The vertical shift registers are CCDs which are driven through the two-phase vertical clock terminals 51, and the charges are fed to the output horizontal shift register 52 through the vertical transfer gate 53 every column. Similarly the horizontal shift register is a CCD which is driven through the two-phase horizontal clock terminals 50, and the charges corresponding to the signal are fed to an output end and are taken out as a signal output. The frequency of the two-phase drive may be selected so as to complete the shift of the horizontal shift register within the pulse period of the applied voltage to the vertical transfer gate.

EMBODIMENT 5

As in Embodiment 1, a switching circuit and a scanning circuit etc. are formed in a predetermined semiconductor body. Subsequently, a Se-As layer (arsenic content: 5 atomic-%) is formed as in the foregoing embodiment. Herein, however, the method of formation was such that a Se-As layer of 0.3 μm was first evaporated without heating, whereupon the same Se-As layer of 3 μm as in the foregoing was evaporated while heating the substrate at 75° C. The photoconductive film is flattened by this step. Thereafter, the heating of the substrate was stopped, and a Se-As-Te layer (As: 2 atomic-%, Te: 21 atomic-%) and a Se-As layer (AS: 6 atomic-%) were evaporated. A transparent electrode was formed after the completion of the evaporation, and a good imaging device similar to the foregoing embodiment was obtained. By a similar method, a device was also fabricated. A Se-As layer of 0.2 μm was evaporated without heating, a Se-As layer of 2 μm was evaporated with heating (80° C.), and a Se-As layer of 0.5 μm was evaporated without heating. Subsequently, a Se-As-Te layer and a Se-As layer were stacked as in the foregoing. This device produced similar results. To form the thin Se-As layer without heating on the semiconductor body in advnace in this manner is useful for lowering the probability of occurrence of the flaws of the photoconductive film still more.

What is claimed is:

1. A photoelectric device comprising:
   a solid state imaging device having a semiconductor substrate including a plurality of photoelectric conversion portions; and
   scanning means coupled to said substrate for selecting photoelectric conversion portions from said plurality of photoelectric conversion portions,
   wherein the photoelectric conversion portions include a photoconductive layer which covers said semiconductor substrate and which lies electrically in contact with at least said scanning means, and a light transmissive electrode which is formed on said photoconductive layer, characterized in that said photoconductive layer is made of an amorphous chalcogenide material whose principal constituent is Se.

2. A photoelectric device according to claim 1, characterized in that said photoconductive layer made of said amorphous chalcogenide material whose principal constituent is Se has a region doped with Te, in at least a part thereof in a thickness direction thereof.

3. A photoelectric device according to claim 2, characterized in that said photoconductive layer is formed of at least (a) a first part which contains Se, which is doped with at least one member selected from the group consisting of Te and an element to form deep levels in Se, and in which a quantity of Te and a quantity of the element to form the deep levels in Se are, respectively, at most 10 atomic-% on the average, (b) a second part which contains Se, and in which a peak concentration of a continuous distribution of the element adapted to form the deep levels in Se, the second part being doped with said element, is at least 15 atomic-%, (c) a third part which contains Se, and in which a peak concentration of a continuous distribution of Te, the third part being doped with the Te, is at least 15 atomic-%, and (d) a fourth part which contains Se, which is doped with at least one member selected from the group consisting of Te and the element to form the deep levels in Se, and in which a quantity of Te and that of the element to form the deep levels in Se are, respectively, at most 15 atomic-% on the average, the respective parts being adjacent in succession.

4. A photoelectric device according to claim 3, characterized in that said element to form the deep level in Se has a concentration gradient within said second part, the concentration being the highest in the vicinity of an interface of said second part with said third part and decreasing smoothly towards the vicinity of an interface thereof with said first part.

5. A photoelectric device according to any of claims 2, 3 or 4 characterized in that the transparent second electrode is formed on said photoconductive layer through a blocking layer.

6. A photoelectric device according to any of claims 1, 2, 3 or 4, characterized in that said scanning means includes switching means arrayed in the shape of a matrix on said semiconductor substrate, and that it includes at least a horizontal scanning circuit and a vertical scanning circuit which serve to drive said switching means to take out signals from said photoelectric conversion portions, and a plurality of electrodes which are independent of one another and which are selected by the horizontal and vertical scanning circuits.

7. A photoelectric device according to claim 1, characterized in that said photoconductive layer includes a lower surface which electrically contacts said scanning means and an upper surface which has been flattened by a heat treatment.

8. A photoelectric device according to claim 3, wherein said element to form the deep levels is at least one member selected from the group consisting of a Group-Vb element and a Group-IV element and a compound containing one of said elements.

* * * * *